(12) United States Patent
Sun

(10) Patent No.: US 7,079,093 B2
(45) Date of Patent: Jul. 18, 2006

(54) ORGANIC LIGHT EMITTING DIODES DISPLAY

(75) Inventor: Wein-Town Sun, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 349 days.

(21) Appl. No.: 10/417,875

(22) Filed: Apr. 17, 2003

(65) Prior Publication Data

US 2004/0178719 A1    Sep. 16, 2004

(30) Foreign Application Priority Data

Mar. 10, 2003 (TW) .............................. 92105134 A

(51) Int. Cl.
*H05B 33/00* (2006.01)
*H05B 33/02* (2006.01)

(52) U.S. Cl. ................. 345/82; 313/293; 313/302; 313/304; 313/338; 313/500; 313/503; 313/504; 313/505; 345/55; 345/58; 345/76; 345/103

(58) Field of Classification Search .............. 313/293, 313/302, 304, 338, 500, 503–505; 345/55, 345/58, 76, 82, 103
See application file for complete search history.

(56) References Cited

U.S. PATENT DOCUMENTS

| | | | | |
|---|---|---|---|---|
| 6,013,538 A | * | 1/2000 | Burrows et al. | .............. 438/22 |
| 6,072,450 A | * | 6/2000 | Yamada et al. | ............... 345/76 |
| 2003/0001488 A1 | * | 1/2003 | Sundahl | ...................... 313/483 |
| 2003/0132896 A1 | * | 7/2003 | Matsueda | ..................... 345/55 |

OTHER PUBLICATIONS

Kodak, What is Active Matrix?, http://www.kodak.com/eknec/PageQuerier.jhtml?pq-path=1489/1493&pq-locale=en_US.*

* cited by examiner

*Primary Examiner*—Sumati Lefkowitz
*Assistant Examiner*—Alexander S. Beck
(74) *Attorney, Agent, or Firm*—Thomas, Kayden, Horstemeyer & Risley

(57) ABSTRACT

An organic light emitting diodes display device includes a number of data lines, scan lines, and cathode electrodes. These scan lines are perpendicular to the data lines to form a number of pixels, each of which possess a pixel area respectively. All the pixels areas form a pixel area array. These cathode electrodes are parallel to the scan lines or data lines and partially cover the pixel area array. Spaces between each two cathode electrodes are above the scan lines or data lines to avoid the parasitic capacitance between the cathode electrodes and scan lines or data lines. And thus the resistance capacitance time delay is prevented.

24 Claims, 8 Drawing Sheets

ORGANIC LIGHT EMITTING DIODES DISPLAY

This application claims the benefit of Taiwan application Serial No. 92105134, filed Mar. 10, 2003.

BACKGROUND OF THE INVENTION

1. Field of the Invention

The present invention relates in general to an organic light emitting diode (OLED) display, and more particularly to an OLED display which is able to avoid the parasitic capacitance between the cathode electrodes and scan lines or data lines, and thus the consequential resistance capacitance time delay (RC delay) is prevented.

2. Description of the Related Art

OLED display technology requires no backlighting—unlike liquid crystal display (LCD) panel, since OLED pixels are self-luminous by way of current driven or voltage driven. Additional advantages of OLED displays are exceptionally wide viewing angle and full-colour. Therefore, the OLED displays are expected to replace LCDs in most flat-panel display applications which include personal digital assistants (PDAs), cell phones, and more.

FIG. 1 is a schematic diagram showing a circuit configuration of a conventional OLED display. An OLED display 100 includes a data driver 120, a scan driver 130, a cathode electrode 108, data lines 102, power lines 104, scan lines 106, pixel areas 110, $V_{SS}$ 140a and 140b, metal layers 150a, 150b, 150c and 150d, and contact holes 160a, 160b, 160c and 160d.

The data lines 102 are parallel to the power supply lines 104. And both the data lines 102 and the power lines 104 are perpendicular to the scan lines 106 to form a number of pixels, each of which possesses a pixel area 110, respectively. All the pixel areas 110 form a pixel area array 115.

The data driver 120 drives all the data lines 102 and provides the data lines with data signals. The data lines 102 then transmit the data signals to the corresponding pixels. The scan driver 130 drives all the scan lines 106 and provides the scan lines with scan signals. The scan lines 106 then transmit the scan signals to the corresponding pixels. Besides, the power supply lines 104 function as transmitting the power to the corresponding pixels. Each pixel generates different levels of brightness according to the level of voltage it receives.

The pixel area array 115 is surrounded by the metal layers 150a, 150b, 150c, and 150d, which are respectively at the upper side, right side, bottom side, and left side of the pixel area array 115. The $V_{SS}$ 140a and 140b are electrically coupled to the metal layers 150a, 150b, 150c, and 150d.

The cathode electrode 108 covers the pixel area array 115 and the metal layers 150a, 150b, 150c, and 150d including the scan lines 106, the data lines 102, and the power supply lines 104. The cathode electrode 108 is electrically coupled to the metal layers 150a, 150b, 150c, and 150d through the contact holes 160a, 160b, 160c, and 160d outside of the pixel area array 115. Therefore, the cathode electrode 108 can be electrically coupled to the $V_{SS}$ 140a and 140b.

In addition, there are at least two thin film transistors (TFTs), a capacitor, and an electroluminescence display device 170 for each pixel.

FIG. 2 is a cross-sectional view of the conventional OLED display in FIG. 1. Three pixels of the OLED display are shown in FIG. 2 for example. The gate of TFT 205 is formed on the transparent substrate 202 and is covered by the gate insulating layer 203. The scan lines 106 shown in FIG. 1 (not shown in FIG. 2) are formed on the transparent substrate 202 and also covered by the gate insulating layer 203. Further, the drain and source of TFT 205 are formed on the gate insulating layer 203. The drain and source of TFT 205 are covered by the interlayer insulating layer 204 which is further covered by the planarization insulating layer 206. The data lines 102 and the power supply lines 104 are disposed on the interlayer insulating layer 204 and covered by the planarization insulating layer 206. The anode electrodes 207 are formed on the surface of the planarization insulating layer 206, corresponding to each pixel. Furthermore, the sources of the TFT 205 are coupled to the anode electrode 207 and the drains of the TFT 205 are coupled to the power supply lines 104.

The stack structure of a second TFT in each pixel (not shown in FIG. 2), other than the TFT 205, is similar to the TFT 205, but it is electrically coupled to the capacitor and the drain thereof is electrically coupled to the data lines 102.

The hole transport layer 208 is formed on the anode electrode 207 and the planarization insulating layer 206, covering all pixels. The emissive layer 209 is formed on the hole transport layer 208, corresponding to each pixel. The electron transport layer 210 is formed on the emissive layer 209 and the hole transport layer 208, covering all pixels. The cathode electrode 108 is formed on the electron transport layer 210. Therefore, the anode electrodes 207, the hole transport layer 208, the emissive layer 209, the electron transport layer 210, and the cathode electrode 108 together form the electroluminescence display device 170. The holes and the electrons respectively transmitted from the hole transport layer 208 and the electron transport layer 210 meet in the emissive layer 209 so that light can be emitted from the emissive layer 209 toward outside along the direction indicated by the arrow 250, as shown in FIG. 2.

However, the image quality of the OLED display will be affected by the resistance capacitance time delay (RC delay). The RC delay is caused from the parasitic capacitance between the cathode electrode 108 and scan lines or data lines respectively. From a top view, the scan lines 106 and the data lines 102 are covered under the cathode electrode 108 of a conventional OLED display according to the overall covering cathode electrode.

FIG. 3A is a cross-sectional view of a part of FIG. 1 around the data line. The circuit configuration of the OLED display 100 is a multi-layer stack structure whose arrangement from bottom to top is the transparent substrate 202, the gate insulating layer 203, the interlayer insulating layer 204, the data lines 102, the planarization insulating layer 206, the hole transport layer 208, the electron transport layer 210, and the cathode electrode 108.

The parasitic capacitance between the cathode electrode 108 and the data lines 102 is formed since the cathode electrode 108 is above the data lines 102 to affect image quality and cause the resistance capacitance time delay. Furthermore, it will result in the data signals delay of the data lines 102.

FIG. 3B is a cross-sectional view of a part of FIG. 1 around the scan line. The multi-layer stack structure of the OLED display 100 arranged from bottom to top is the transparent substrate 202, the scan lines 106, the gate insulating layer 203, the interlayer insulating layer 204, the planarization insulating layer 206, the hole transport layer 208, the electron transport layer 210, and the cathode electrode 108.

Also, the parasitic capacitance between the cathode electrode 108 and the scan lines 106 is formed since the cathode electrode 108 is above the scan lines 106 to cause the resistance capacitance time delay. Furthermore, it will result in the scan signals delay of the scan lines 106.

As the size of OLED display 100 extends, the amount of the parasitic capacitance respectively forming between the cathode electrode 108 and the data lines 102 or the scan lines 106 grows and it will result in worse RC delay. The problems such as cross talk and inefficiency of the power supply affect the OLED display 100 hugely because the data signals delay and the scan signals delay are both resulted from the RC delay respectively. Besides, owing to the capacitive losses power is in proportion to the parasitic capacitance, the capacitive losses power of the OLED display 100 will increase relatively with the increasing parasitic capacitance when the OLED display size extends.

SUMMARY OF THE INVENTION

It is therefore an object of the invention to provide an improved OLED display with space in cathode electrodes where the space is above scan lines or data lines so that this device is able to avoid the parasitic capacitance between the cathodes and scan lines or data lines. And thus the resistance capacitance time delay and the scan and data signals delay are prevented.

In accordance with the present invention, an improved OLED display includes a number of data lines, scan lines, and cathode electrodes. These scan lines are perpendicular to the data lines to form a number of pixels, each of which possess a pixel area respectively. All the pixel areas form a pixel area array. These cathode electrodes are parallel to the scan lines or the data lines and partially cover the pixel area array. There is a space between each two cathode electrodes, and the space is above the scan lines or data lines.

The invention achieves the above-identified object by providing another improved OLED display includes a number of data lines, scan lines, and cathode electrodes. These scan lines are perpendicular to the data lines to form a number of pixels, each of which possess a pixel area respectively. All the pixel areas form a pixel area array. These cathode electrodes are parallel to the scan lines or the data lines and partially cover the pixel area array. There is a space between each two cathode electrodes and the space is above the scan lines or data lines. The cathode electrodes further includes a number of recesses, which is adjacent to the spaces and exposes the scan lines or the data lines.

Further, another improved OLED display in accordance with the present invention includes a number of data lines, scan lines and a cathode electrode. These scan lines are perpendicular to the data lines to form a number of pixels, each of which possess a pixel area respectively. All the pixel areas form a pixel area array. This cathode electrode covers mostly the pixel area array and possesses a number of openings that exposes the projective crosses and is above the scan lines or data lines.

Other objects, features, and advantages of the invention will become apparent from the following detailed description of the preferred but non-limiting embodiments. The following description is made with reference to the accompanying drawings.

DETAILED DESCRIPTION OF THE INVENTION

In this invention, an OLED display includes a number of data lines, scan lines, and cathode electrodes. These scan lines are perpendicular to the data lines to form a number of pixels, each of which possess a pixel area, respectively. All the pixel areas form a pixel area array.

The present invention aims to diminish the cover area of the cathode electrodes above the scan lines or the data lines and reduce the parasitic capacitance to avoid the data signals delay or the scan signals delay. The practical applications of the cathode electrodes are described as following five examples with relating figures, respectively.

EXAMPLE 1

Figure 1:
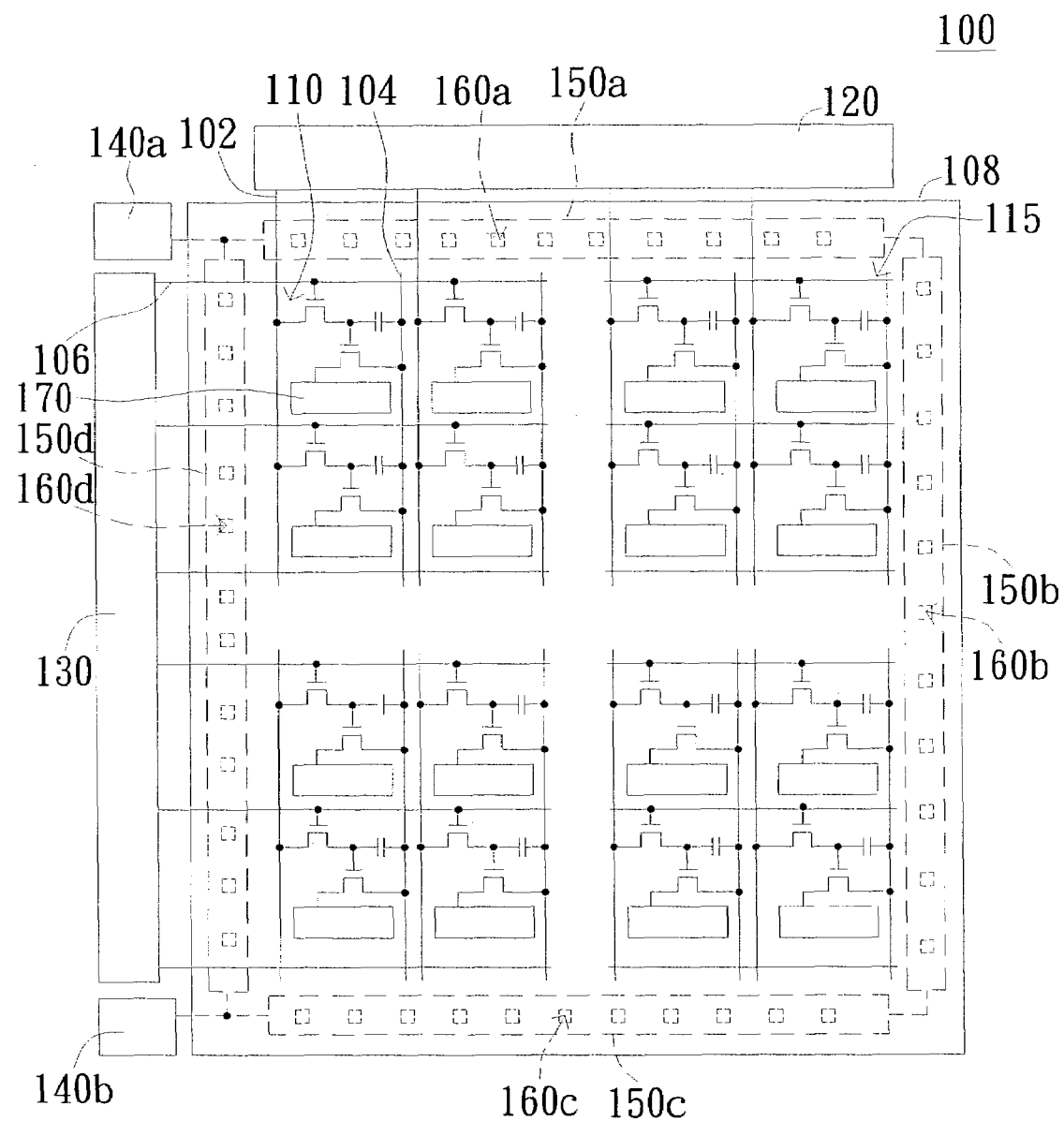
FIG. 1 (Prior Art) is a schematic diagram showing a circuit configuration of a conventional OLED display.
Figure 2:
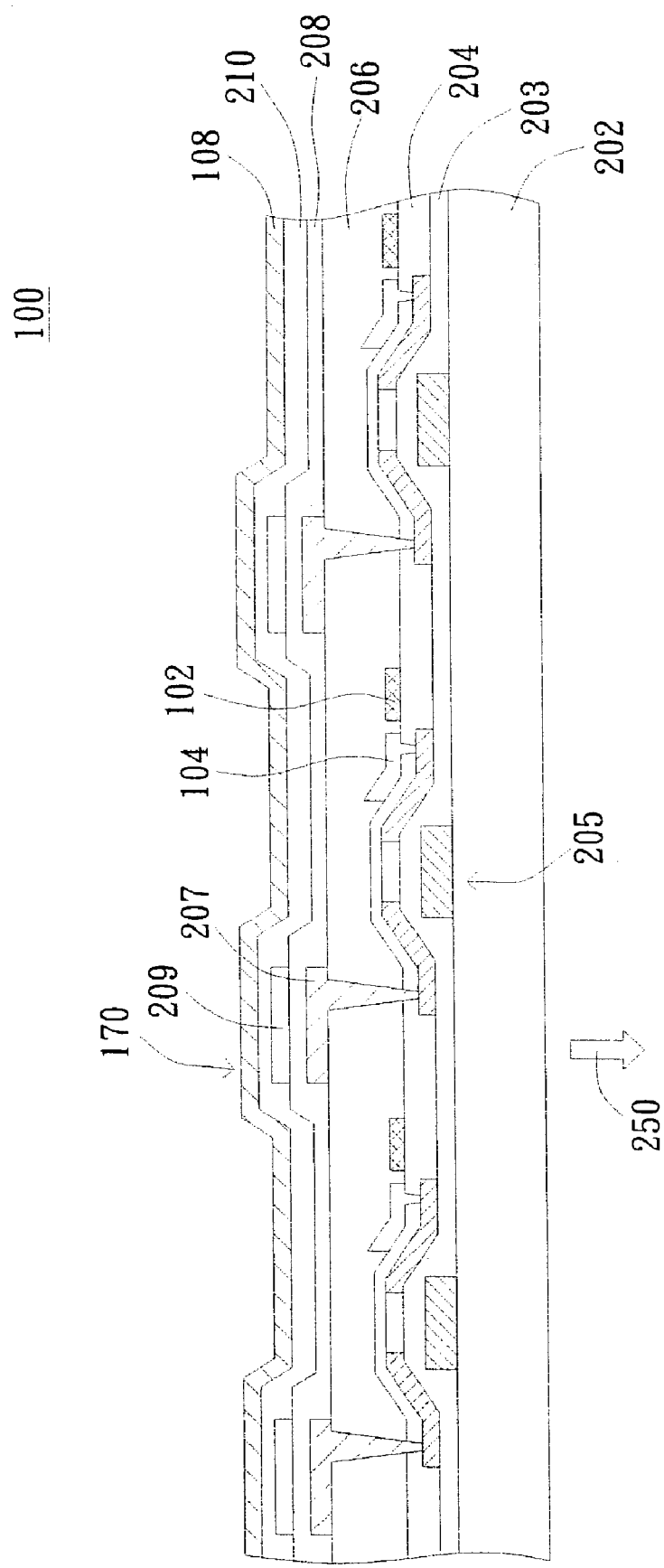
FIG. 2 (Prior Art) is a cross-sectional view of the conventional OLED display in FIG. 1.
Figure 3A:
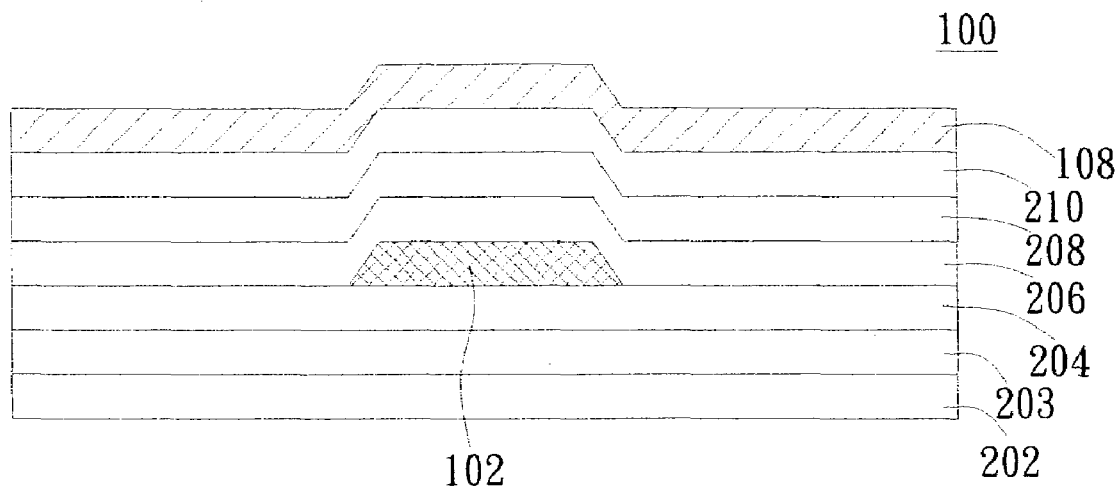
FIG. 3A (Prior Art) is a cross-sectional view of a part of FIG. 1 around the data line of the conventional OLED display.
Figure 3B:
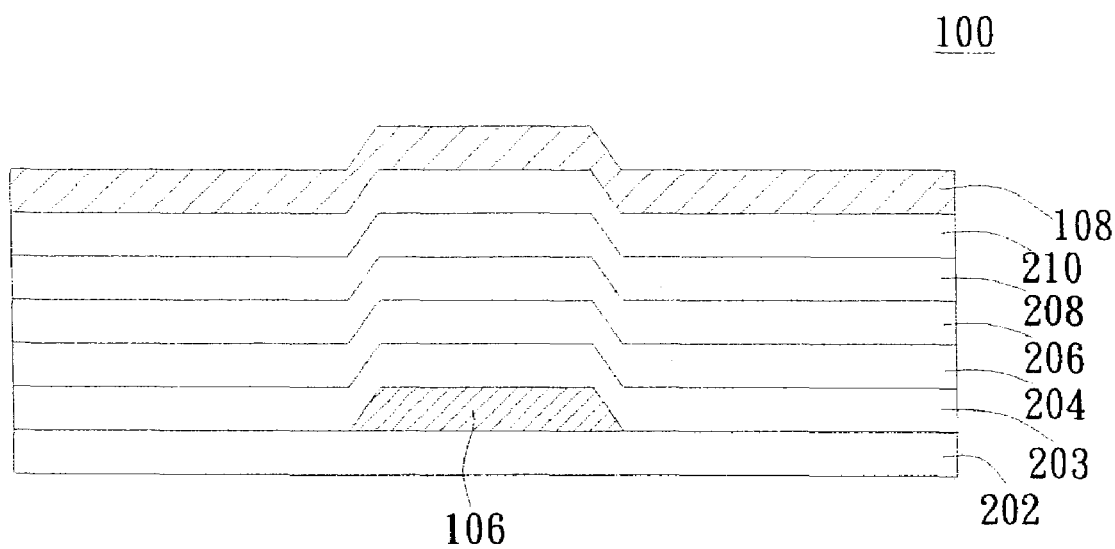
FIG. 3B (Prior Art) is a cross-sectional view of a part of FIG. 1 around the scan line of the conventional OLED display.
Figure 4:
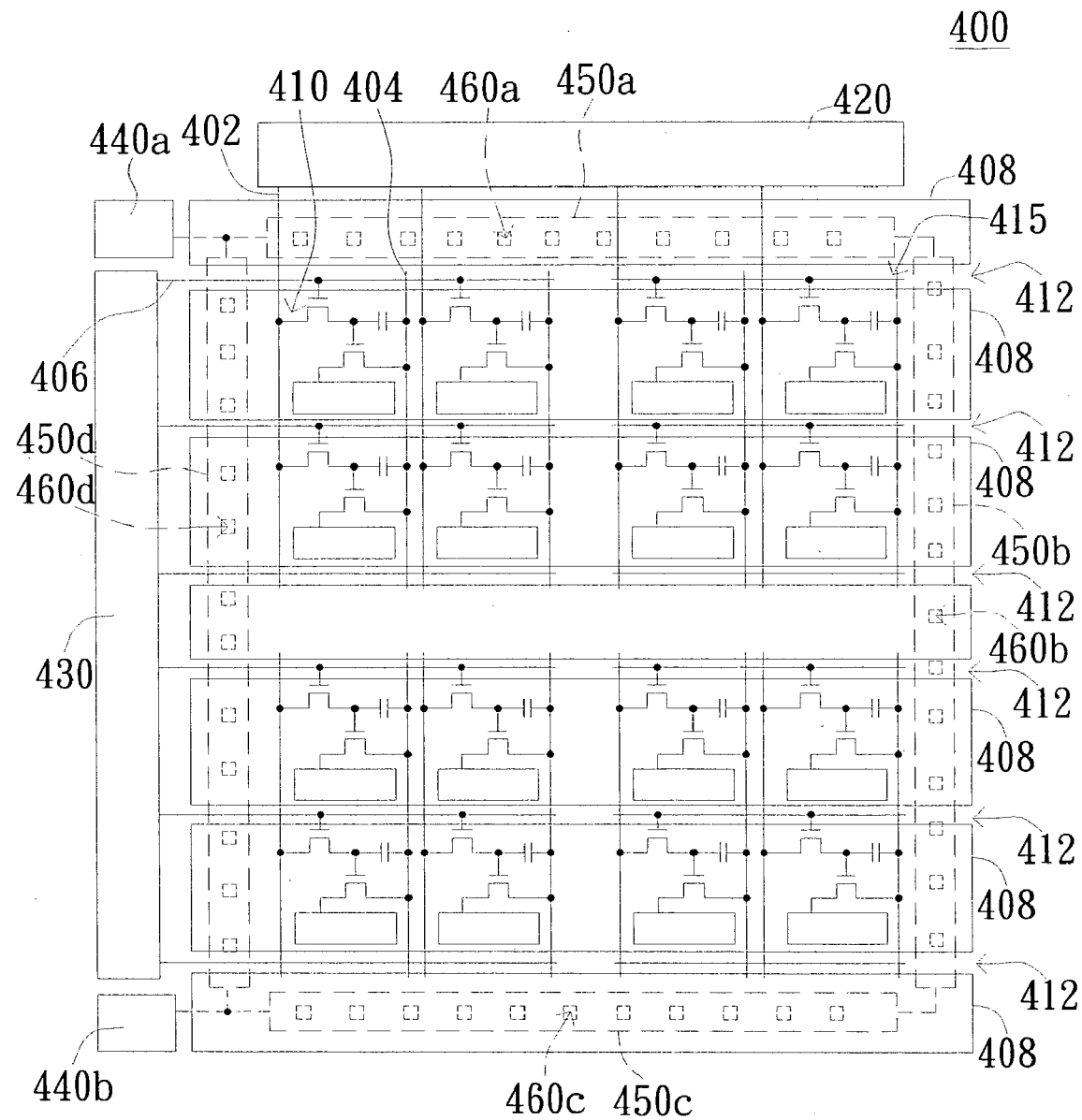
FIG. 4 is a schematic diagram illustrating a circuit configuration of an OLED display according to the first embodiment of the invention.

FIG. 4 is a schematic diagram illustrating a circuit configuration of an OLED display according to the first embodiment of the invention. Referring to FIG. 4, an OLED display 400 includes a data driver 420, a scan driver 430, a number of data lines 402, power supply lines 404, scan lines 406, pixel areas 410, cathode electrodes 408, $V_{SS}$ 440a and 440b, metal layers 450a, 450b, 450c and 450d, and contact holes 460a, 460b, 460c and 460d.

Multiple data lines 402 and the scan lines 406 forms multiple pixels, each of which possess a pixel area 410, respectively. All the pixel areas 410 together form a pixel area array 415. The data driver 420 drives all the data lines 402 and provides the data lines 402 with data signals. The data lines 402 then transmit the data signals to the corresponding pixels. The scan driver 430 drives all the scan lines 406 and provides the scan lines 406 with scan signals. The scan lines 406 then transmit the scan signals to the corresponding pixels. Besides, the power supply lines 404 function as transmitting the power to the corresponding pixels. Each pixel generates different levels of brightness according to the level of voltage it receives.

The pixel area array 415 is surrounded by the metal layers 450a, 450b, 450c and 450d, which are respectively at the upper side, right side, bottom side, and left side of the pixel area array 415. The $V_{SS}$ 440a and 440b are set at both sides of the scan driver circuit 430 and electrically coupled to the metal layers 450a, 450b, 450c, and 450d.

The cathode electrodes 408 cover the pixel area array 415 and the metal layers 450a and 450c and cover partially the metal layers 450b and 450d in a direction parallel the scan lines 406. Spaces 412 between each two cathode electrodes 408 are above the scan lines 406. The cathode electrode 408 can be electrically coupled to the $V_{SS}$ 440a and 440b by being electrically coupled to the metal layers 450a, 450b, 450c, and 450d through the contact holes 460a, 460b, 460c, and 460d.

The cathode electrodes 408 can effectively reduce the parasitic capacitance between the cathode electrodes 408 and the scan lines 406 so that the scan signal delay of the scan lines 406 is prevented.

EXAMPLE 2

Figure 5:
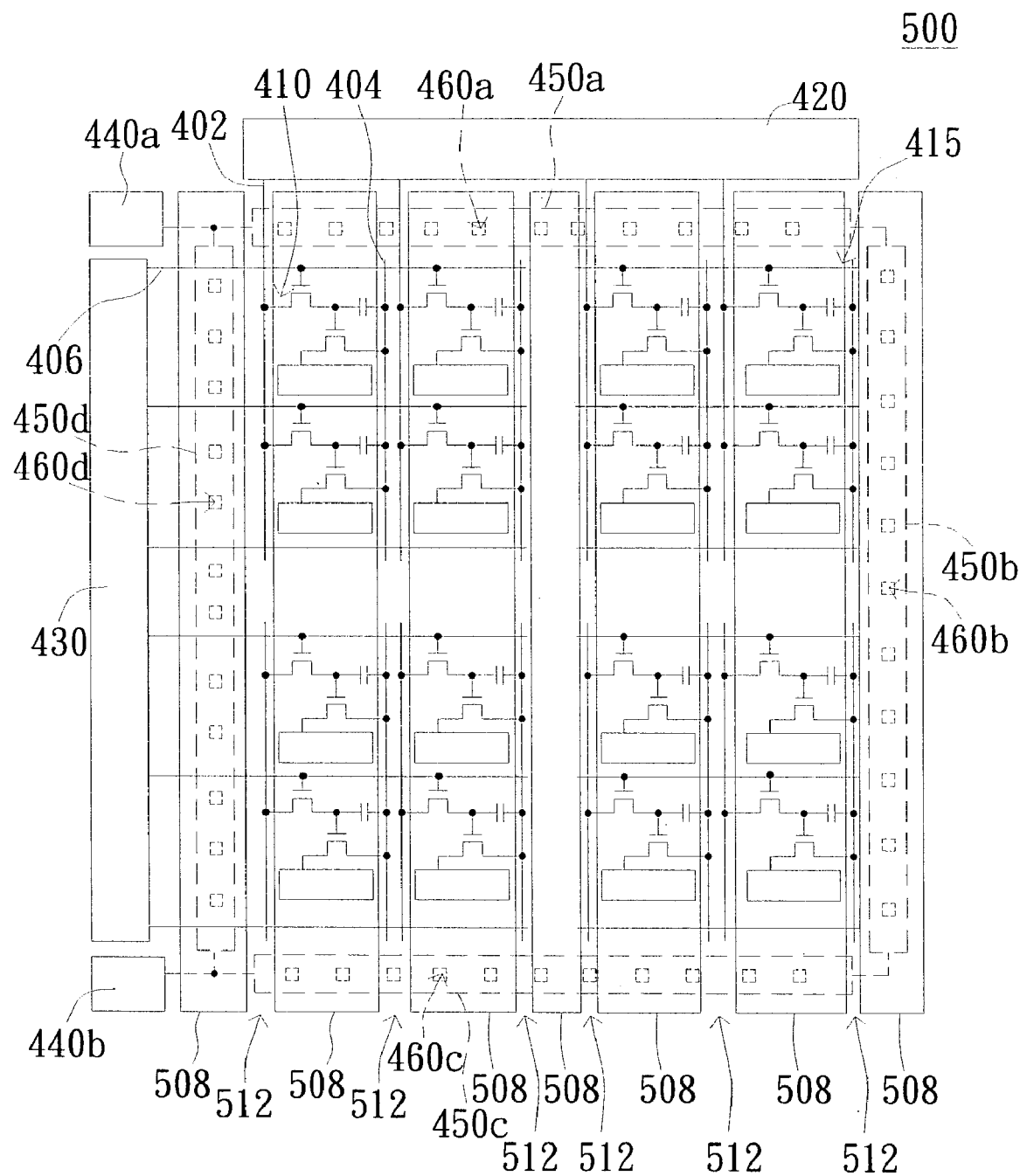
FIG. 5 is a schematic diagram illustrating a circuit configuration of an OLED display according to the second embodiment of the invention.

FIG. 5 is a schematic diagram illustrating a circuit configuration of an OLED display according to the preferred embodiment of the invention. Referring to FIG. 5, the OLED display 500 differs from the OLED display 400 shown in FIG. 4 in that the cathode electrodes 508 cover the pixel area array 415 and the metal layers 450b and 450d and partly cover the metal layers 450a and 450c in a direction parallel to the data lines 402. There is a space 512 between each two cathode electrodes 508, and each space 512 is above the data lines 402 and the power supply lines 404. The cathode electrode 508 can be electrically coupled to the $V_{SS}$ 440a and 440b by being electrically coupled to the metal layers 450a, 450b, 450c, and 450d through the contact holes 460a, 460b, 460c, and 460d.

The cathode electrodes 508 can reduce the parasitic capacitance between the cathode electrodes 508 and the data lines 402 so that the data signals delay of the data lines 402 is prevented.

EXAMPLE 3

Figure 6:
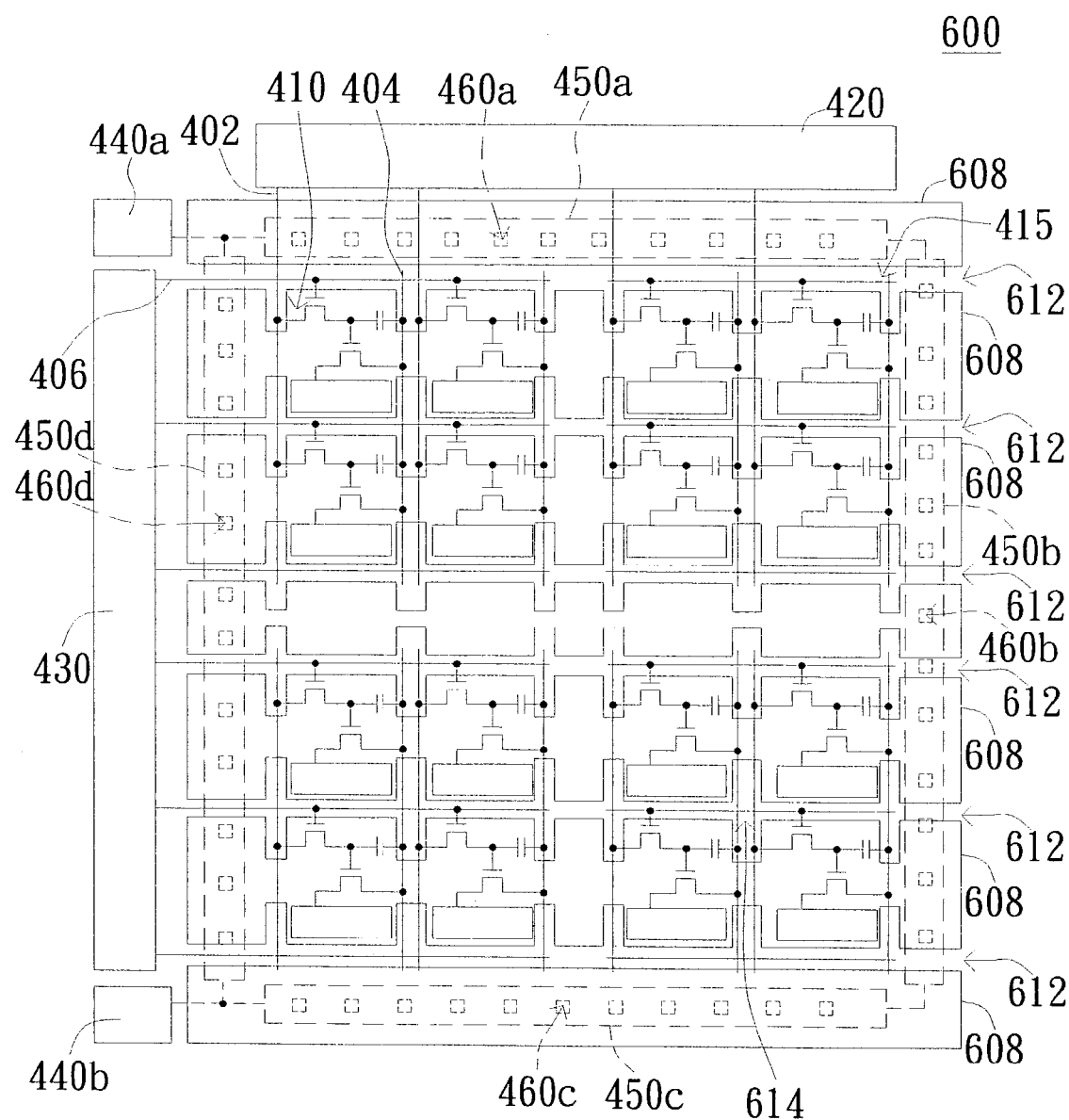
FIG. 6 is a schematic diagram illustrating a circuit configuration of an OLED display according to the third embodiment of the invention.

FIG. 6 is a schematic diagram illustrating a circuit configuration of an OLED display according to the third embodiment of the invention. Referring to FIG. 6, the OLED display 600 differs from the OLED display 400 shown in FIG. 4 in that the cathode electrodes 608 cover the pixel area array 415 and the metal layers 450a and 450c and partially cover the metal layers 450b and 450d in a direction parallel to the scan lines 406. There is a space 612 between each two cathode electrodes 608, and each space 612 is above the scan lines 606. The cathode electrodes 608 further includes a number of recesses 614. The recesses 614 are adjacent to the spaces 612 and above the data lines 402, or the power supply lines 404. Consequently, the cathode electrodes 608 cover less than 90% of the data lines 402 and also the power supply lines 404. Besides, the cathode electrode 608 can be electrically coupled to the $V_{SS}$ 440a and 440b by being electrically coupled to the metal layers 450a, 450b, 450c, and 450d through the contact holes 460a, 460b, 460c, and 460d.

The cathode electrodes 608 can effectively reduce the parasitic capacitance between the cathode electrodes 608 and the scan lines 406 and part of the parasitic capacitance between the cathode electrodes 608 and the data lines 402 so that the scan signals and the data signals delay are reduced.

EXAMPLE 4

Figure 7:
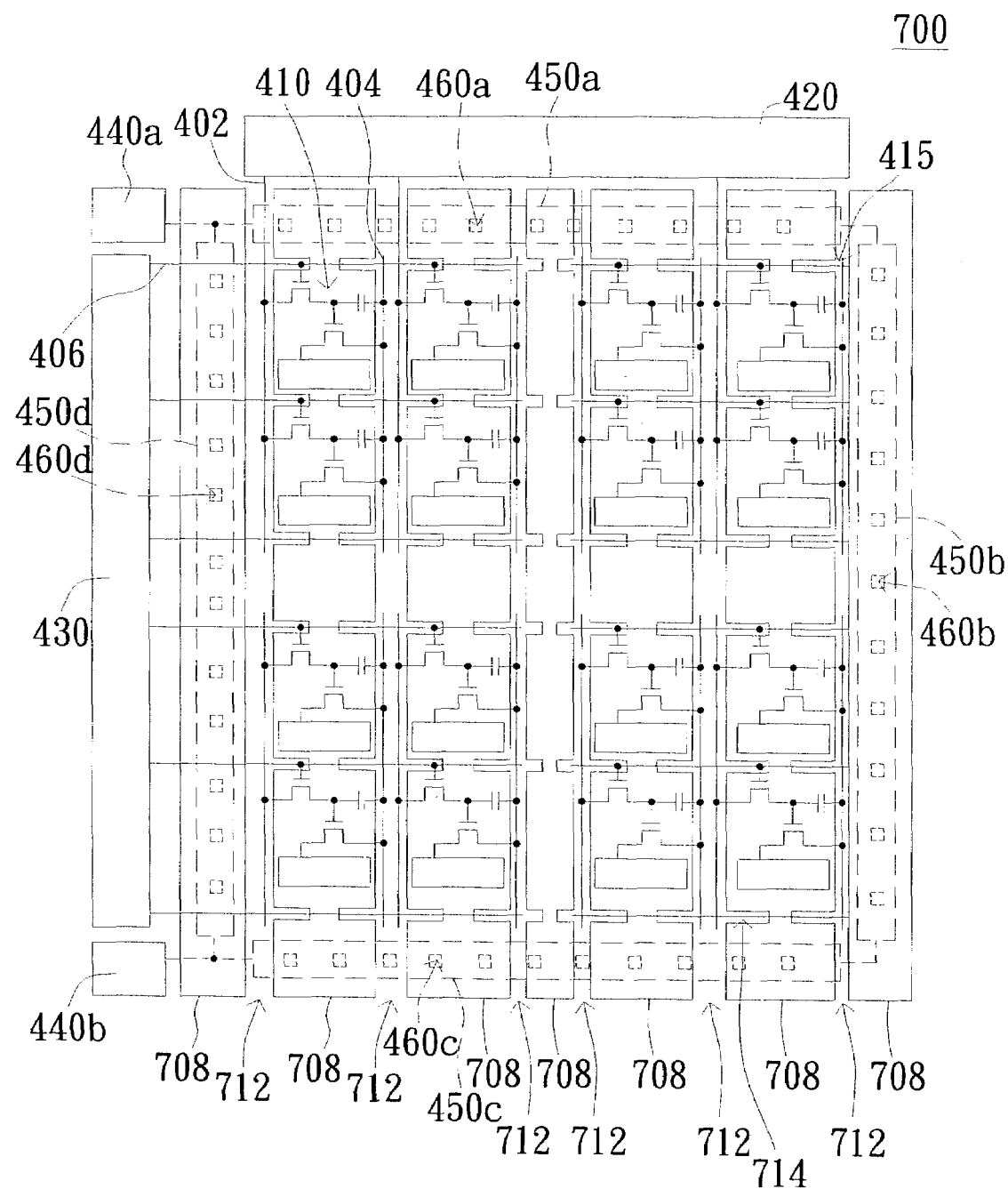
FIG. 7 is a schematic diagram illustrating a circuit configuration of an OLED display according to the fourth embodiment of the invention.

FIG. 7 is a schematic diagram illustrating a circuit configuration of an OLED display according to the fourth embodiment of the invention. Referring to FIG. 7, the OLED display 600 differs from the OLED display 500 shown in FIG. 5 in that the cathode electrodes 708 cover the pixel area array 415 and the metal layers 450b and 450d and partially cover the metal layers 450a and 450c in a direction parallel to the data lines 402. There is a space 712 between each two cathode electrodes 708, and each space 712 is above the data lines 402 or the power supply lines 404. The cathode electrodes 708 further include a number of recesses 714. The recesses 714 are adjacent to the spaces 712 and above the scan lines 406. Consequently, the cathode electrodes 708 cover less than 90% of the scan lines 406. Besides, the cathode electrode 708 can be electrically coupled to the $V_{SS}$ 440a and 440b by being electrically coupled to the metal layers 450a, 450b, 450c, and 450d through the contact holes 460a, 460b, 460c, and 460d.

The cathode electrodes 708 can effectively reduce the parasitic capacitance between the cathode electrodes 708 and the data lines 402 and part of the parasitic capacitance between the cathode electrodes 708 and the scan lines 406 so that the scan signals and the data signals delay are reduced.

EXAMPLE 5

Figure 8:
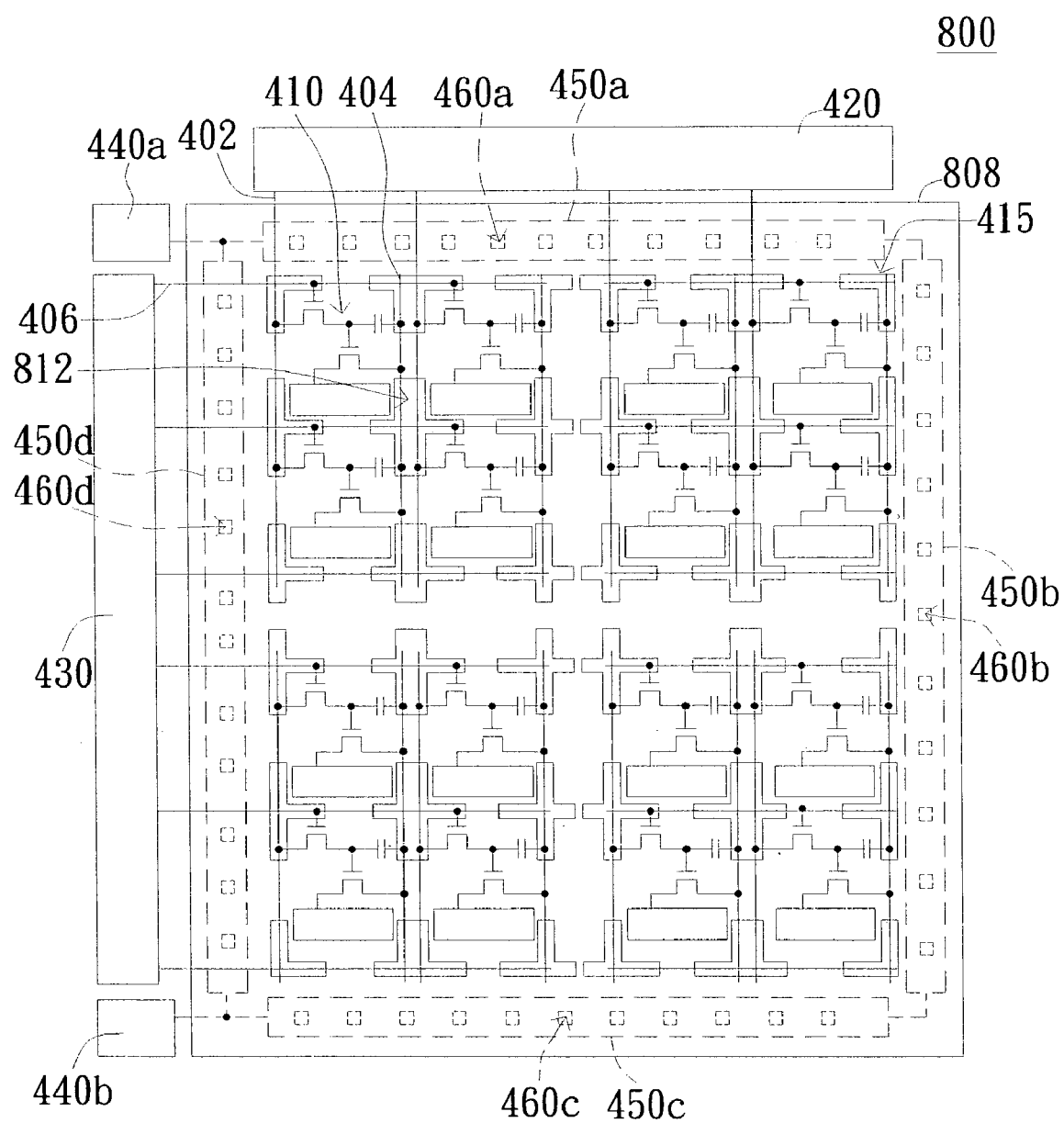
FIG. 8 is a schematic diagram illustrating a circuit configuration of an OLED display according to the fifth embodiment of the invention.

FIG. 8 is a schematic diagram illustrating a circuit configuration of an OLED display according to the fifth embodiment of the invention. Referring to FIG. 8, the cathode electrode 808 of the OLED display 800 covers mostly but not thoroughly the pixel area array 415 and the metal layers 450a, 450b, 450c and 450d. The scan lines 406 do not substantially cross the data lines 402 and the power supply lines 404. However, in order to describe the layout of the cathode electrodes, where the data lines 402 cross the power supply lines 404, and the scan lines 406, from a top view, are defined as "projective crosses", herein. A number of openings 812, preferably in the shape of a cross, are approximately above the projective crosses. Therefore, the cathode electrodes 708 cover less than 90% of the data lines 402, the power supply lines 404 and also the scan lines 406. Besides, the cathode electrode 808 can be electrically coupled to the $V_{SS}$ 440a and 440b by being electrically coupled to the metal layers 450a, 450b, 450c, and 450d through the contact holes 460a, 460b, 460c, and 460d.

The layout of the cathode electrodes 808 according to the fifth embodiment, can effectively reduce part of the parasitic capacitance between the cathode electrodes 708 and the data lines 402 and part of the parasitic capacitance between the cathode electrodes 708 and the scan lines 406 so that the scan signals and the data signals delay are reduced.

However, the present inventions are not just limited in what are described above. For example, the cathode electrodes 408, 508, 608, 708, and 808 can be fabricated by using a shadow mask, by etching, lifting off, or patterning in the OLED display 400, 500, 600, 700, and 800 individually.

With the above configurations of diminishing the cover area of the cathode electrodes above scan lines or data lines, the parasitic capacitance between the cathode electrodes and the scan lines or the data lines is effectively reduced. The data signals delay and the scan signals delay reduce as the parasitic capacitance decreases. The power supply inefficiency and cross talk problems are resolved, and the capacitive losses power of the OLED display is thus improved.

While the invention has been described by way of examples and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display, comprising:
   a plurality of data lines;
   a plurality of scan lines perpendicular to the data lines, wherein the scan lines and the data lines define a plurality of pixels, each of the pixels has a pixel area and the aligned pixel areas form a plurality of pixel area arrays parallel to the scan lines or the data lines;
   a plurality of spaced cathode electrodes parallel to the scan lines or the data lines and each of the spaced cathode electrodes covering one of the pixel area arrays; and
   a metal layer surrounding the plurality of pixel area arrays, for being partially covered by the plurality of spaced cathode electrodes, wherein the plurality of spaced cathode electrodes are coupled to the metal layer through contact holes outside of the pixel area arrays,
   wherein there is a space between each two of said cathode electrodes and said space is above the scan lines or the data lines so that the spaced cathode electrodes uncover the scan lines or the data lines.

2. The OLED display of claim 1, wherein the cathode electrodes are electrically coupled to a voltage $V_{SS}$ through the contact holes and the metal layer.

3. The OLED display of claim 1, wherein the cathode electrodes are fabricated by using a shadow mask.

4. The OLED display of claim 1, wherein the cathode electrodes are fabricated by etching.

5. The OLED display of claim 1, wherein the cathode electrodes are fabricated by lifting off.

6. The OLED display of claim 1, wherein the cathode electrodes are fabricated by patterning.

7. The OLED display of claim 1, further comprising:
   a plurality of power supply lines parallel to data lines for transmitting power to the corresponding pixels, wherein the spaced cathode electrodes uncover both of the power supply lines and the data lines.

8. An organic light emitting diode (OLED) display, comprising:
   a plurality of data lines;
   a plurality of scan lines perpendicular to the data lines, wherein the scan lines and the data lines define a plurality of pixels, each of the pixels has a pixel area and the aligned pixel areas form a plurality of pixel area arrays parallel to the scan lines or the data lines;
   a plurality of spaced cathode electrodes parallel to the scan lines or the data lines and each of the spaced cathode electrodes covering one of the pixel area arrays; and
   a metal layer surrounding the plurality of pixel area arrays, for being partially covered by the plurality of spaced cathode electrodes, wherein the plurality of spaced cathode electrodes are coupled to the metal layer through contact holes outside of the pixel area arrays,
   wherein there is a space between each two of said cathode electrodes and said space is above the scan lines or the data lines, and the cathode electrodes further comprise a plurality of recesses, which are adjacent to the spaces and above the scan lines or the data lines, so that the spaced cathode electrodes uncover the scan lines and part of the data lines or uncover the data lines and part of the scan lines.

9. The OLED display of claim 8, wherein, from a top view, the cathode electrodes cover less than 90% of the data lines if the cathode electrodes are parallel to the scan lines, but the cathode electrodes cover less than 90% of the scan lines if the cathode electrodes are parallel to the data lines.

10. The OLED display of claim 8, wherein the cathode electrodes are electrically coupled to a voltage $V_{SS}$ through the contact holes and the metal layer.

11. The OLED display of claim 8, wherein the cathode electrodes are fabricated by using a shadow mask.

12. The OLED display of claim 8, wherein the cathode electrodes are fabricated by etching.

13. The OLED display of claim 8, wherein the cathode electrodes are fabricated by lifting off.

14. The OLED display of claim 8, wherein the cathode electrodes are fabricated by patterning.

15. The OLED display of claim 8, further comprising:
   a plurality of power supply lines parallel to data lines for transmitting power to the corresponding pixels, wherein the spaced cathode electrodes uncover both of the power supply lines and the data lines.

16. An organic light emitting diode (OLED) display, comprising:
   a plurality of data lines;
   a plurality of scan lines perpendicular to the data lines to form a plurality of pixel areas respectively, wherein, from a top view, where the scan lines and the data lines crosses are defined as projective crosses;
   a cathode electrode for covering partially the pixel areas and possessing a plurality of openings corresponding to the projective crosses; and
   a metal layer surrounding the plurality of pixel areas, for being covered by the cathode electrode, wherein the cathode electrode is coupled to the metal layer through contact holes outside of the pixel areas,
   wherein the openings are above the projective crosses and part of the scan lines and the data lines away from the projective crosses, so that the cathode electrode uncovers part of the data lines and part of the scan lines.

17. The OLED display of claim 16, wherein the openings are in the shape of a cross and are above the projective crosses.

18. The OLED display of claim 16, wherein the openings are in the shape of a stripe and are away from the projective crosses.

19. The OLED display of claim 16, wherein the cathode electrode covers less than 90% of the scan lines and covers less than 90% of the data lines.

20. The OLED display of claim 16, wherein the cathode electrode is electrically coupled to a voltage $V_{SS}$ through the contact holes and the metal layer.

21. The OLED display of claim 16, wherein the cathode electrode is fabricated by etching.

22. The OLED display of claim 16, wherein the cathode electrode is fabricated by lifting off.

23. The OLED display of claim 16, wherein the cathode electrode is fabricated by patterning.

24. The OLED display of claim 16, further comprising:
   a plurality of power supply lines parallel to data lines for transmitting power to the corresponding pixels, wherein the spaced cathode electrodes uncover both of the power supply lines and the data lines.

* * * * *